United States Patent [19]

Shirahata

[11] 4,391,963
[45] Jul. 5, 1983

[54] ORGANOPOLYSILOXANE PHOTOSENSITIZERS AND METHODS FOR THEIR PREPARATION

[75] Inventor: Akihiko Shirahata, Ichihara, Japan

[73] Assignee: Toray Silicone Company, Ltd., Tokyo, Japan

[21] Appl. No.: 382,504

[22] Filed: May 27, 1982

[30] Foreign Application Priority Data

Jun. 18, 1981 [JP] Japan ................................. 56-94130

[51] Int. Cl.³ .............................................. C08G 77/04
[52] U.S. Cl. ....................................... 528/37; 528/15;
528/24; 528/25; 528/26; 528/29; 528/33;
204/159.13
[58] Field of Search ................... 556/436; 528/15, 24,
528/25, 26, 29, 33, 37; 204/159.13

[56] References Cited

U.S. PATENT DOCUMENTS 4,273,907  6/1981  Takamizawa et al. ............... 528/29

FOREIGN PATENT DOCUMENTS 51-34291   3/1976  Japan .
51-48794  12/1976  Japan .
54-44643   4/1979  Japan .

*Primary Examiner*—Melvyn I. Marquis
*Attorney, Agent, or Firm*—George A. Grindahl

[57] ABSTRACT

Novel photosensitizers are disclosed which are particularly useful in photopolymerizable organopolysiloxane and silicone resins. The photosensitizers are themselves organopolysiloxanes which contain at least one silicon-bonded benzoin-containing radical. Synthesis methods are disclosed for preparing these photosensitizers which employ, as starting materials, an alkenyl-substituted benzoin and a silicon compound containing at least one silicon-bonded hydrogen atom.

16 Claims, No Drawings

ORGANOPOLYSILOXANE PHOTOSENSITIZERS AND METHODS FOR THEIR PREPARATION

BACKGROUND OF THE INVENTION

This invention relates to novel photopolymerization sensitizers and to methods for their preparation comprising bonding benzoin derivatives into organopolysiloxanes.

Various photosensitive or photopolymerizable (hereafter to be called photosensitive) resins are conventionally known. Several photopolymerization sensitizers have been developed or proposed for the photopolymerization of these photosensitive resins. The required characteristics for these photopolymerization sensitizers are good sensitizing action and good miscibility with the photosensitive resins. If its miscibility with photosensitive resins is poor, the polymerization sensitizer will separate from the photosensitive resins and the desired sensitization action cannot then be adequately achieved. When the photosensitive resin polymerizes and hardens, nonuniformities are formed therein and the sensitizer is deposited or separated from the hardened photosensitive resin. In cases where photosensitive resins blended with the photopolymerization sensitizer are stored, long-term storage is a problem.

There are many types of conventionally known photosensitive silicone resins and photosensitive organopolysiloxanes and it is necessary to use photopolymerization sensitizers with these resins. For this purpose, sensitizers such as 2,6-dichloro-4-nitroaniline, 2,4-dinitrophenol and other aromatic compounds; Michler's ketone, benzophenone, benzoin, and other ketones; and benzoquinone and other quinones are known to be effective. However, these sensitizers have the drawbacks and disadvantages described above since they are poorly miscible with photosensitive organopolysiloxanes. Sensitizers which are miscible with photosensitive organopolysiloxanes have been proposed in Japanese Patent Sho Nos. 51 (1976)48794, 52(1977)50074 and 54(1979)44643. They are benzophenone derivatives and benzoin derivatives substituted with organosiloxy groups. These sensitizers are complementary materials because the benzophenone moiety has an ultraviolet absorption maximum at 365 nm and the benzoin moiety has an ultraviolet absorption maximum at 247 nm. However, they are not perfectly miscible with photosensitive organopolysiloxanes and they lack hydrolytic stability. Therefore, they have no practical use. This invention was achieved as the result of research by the present inventor in order to overcome these disadvantages of the conventional technologies.

BRIEF SUMMARY OF THE INVENTION

It is an object of this invention to provide novel organopolysiloxane photosensitizers. It is another object of this invention to provide photosensitizers which are readily miscible with photosensitive silicone resins and with photosensitive organopolysiloxanes. It is a further object of this invention to provide photosensitizers which are relatively easily prepared and methods for their preparation. It is yet another object of this invention to provide organopolysiloxane sensitizers that have hydrolytic stability.

These objects, and others which will become obvious after considering the following specification and appended claims, are obtained by chemically bonding certain alkenyl-substituted benzoin derivatives to organopolysiloxanes or to organosilanes, each bearing silicon-bonded hydrogen atoms and, optionally, further polymerizing the product by a siloxane-polymerizing reaction.

DETAILED DESCRIPTION OF THE INVENTION

The present invention relates to an organopolysiloxane photosensitizer comprising an average of at least two siloxane units, of which at least an average of one siloxane unit per organopolysiloxane molecule has the formula $Q_aR_b^5SiO_{(4-a-b)/2}$, wherein Q denotes a benzoin-containing group having the formula

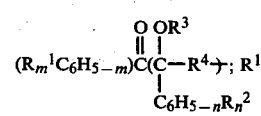

and $R^2$ each denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon atoms or a halogenated monovalent hydrocarbon group; m is an integer of from 1 to 5, n is an integer of from 1 to 5, a is an integer of from 1 to 3, b is an integer of from 0 to 2 and a+b is an integer of from 1 to 3.

The present invention further relates to a method for preparing an organopolysiloxane photosensitizer comprising an average of at least two siloxane units, of which at least an average of one siloxane unit per organopolysiloxane molecule has the formula $Q_aR_b^5SiO_{(4-a-b)/2}$; said method comprising reacting, by a hydrosilylation reaction, an alkenyl-substituted reactant having the formula

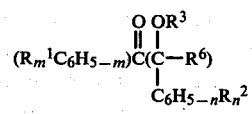

and an organohydrogenpolysiloxane reactant containing at least two siloxane units and at least one silicon-bonded hydrogen atom per molecule, wherein Q denotes a benzoin-containing group having the formula

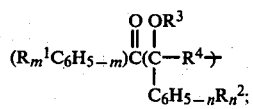

at each occurrence $R^1$ and $R^2$ denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon group; $R^6$ denotes an aliphatically unsaturated monovalent hydrocarbon group having the same number of carbon atoms as the $R^4$ group; m is an integer of from 1 to 5, n is an integer of from 1 to 5, a is an integer of from 1 to 3, b is an integer of from 0 to 2 and a+b is an integer of from 1 to 3; the $R^6$ group becoming the $R^4$ group during said hydrosilylation reaction.

The present invention also relates to a method for preparing an organopolysiloxane photosensitizer comprising an average of at least two siloxane units, of which an average of at least one siloxane unit per organopolysiloxane molecule has the formula $Q_aR_b^5SiO_{(4-a-b)/2}$, said method comprising (A) reacting, by a hydrosilylation reaction to form an adduct, an alkenyl-substituted benzoin reactant having the formula

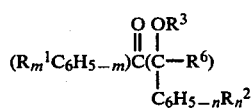

and a silane bearing at least one silicon-bonded hydrogen atom and at least one silicon-bonded hydrolyzable group or a siloxane bearing at least two siloxane units and at least one silicon-bonded hydrogen atom; and (B) polymerizing the adduct or copolymerizing the adduct with another silane bearing at least one silicon-bonded hydrolyzable radical or with a siloxane, both being free of Q groups, to provide the organopolysiloxane photosensitizer, wherein Q denotes a benzoin-containing group having the formula

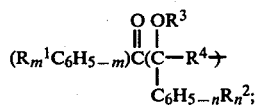

at each occurrence $R^1$ and $R^2$ denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon atoms or a halogenated monovalent hydrocarbon group; $R^6$ denotes an aliphatically unsaturated monovalent hydrocarbon group having the same number of carbon atoms as the $R^4$ group; m is an integer of from 1 to 5, n is an integer of from 1 to 5, a is an integer of from 1 to 3, b is an integer of from 0 to 2 and a+b is an integer of from 1 to 3; the $R^6$ group becoming the $R^4$ group during said hydrosilylation reaction.

The photopolymerization sensitizers of the present invention are organopolysiloxanes having an average of at least one siloxane unit per molecule which bears a silicon-bonded benzoin derivative group. This siloxane unit has the formula $Q_aR_b^5SiO_{(4-a-b)/2}$ wherein Q represents the benzoin derivative group and has the formula

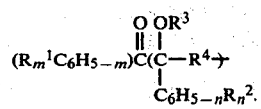

In the above siloxane unit formula a has a value of 1, 2 or 3, b has a value of 0, 1 or 2 and the sum of a+b has a value of 1, 2 or 3, thereby providing siloxane units having the formulae $QSiO_{3/2}$, $QR^5SiO_{2/2}$, $QR_2^5SiO_{1/2}$, $Q_2SiO_{2/2}$, $Q_2R^5SiO_{1/2}$ and $Q_3SiO_{1/2}$. Preferably, a has a value of 1, as illustrated by the first three siloxane units listed.

In the above formula for Q, $R^1$ and $R^2$ each denote hydrogen atoms, amino groups, halogen atoms such as fluorine, chlorine, bromine and iodine; monovalent hydrocarbon group containing 1-10 carbons such as methyl groups, ethyl groups, n-propyl groups, n-butyl groups, t-butyl groups, hexyl groups and octyl groups; alkoxy groups such as methoxy groups, ethoxy groups and propoxy groups; thioalkoxy groups, such as thiomethoxy groups and thioethoxy groups; and dialkylamino groups, such as dimethylamino groups, diethylamino groups and methylpropylamino groups. In a preferred embodiment of this invention, $R^1$ and $R^2$ are hydrogen atoms.

In the above formula for Q, m has a value of from 1 to 5, preferably from 1 to 3, and n has a value of from 1 to 5, preferably from 1 to 3. Of course, in the preferred embodiment wherein $R^1$ and $R^2$ are hydrogen, the values of m an n are effectively, and equivalently, any and all values from 0 to 5.

In the above formula for Q, $R^3$ denotes a hydrogen atom or a monovalent hydrocarbon group having from 1 to 10 carbon atoms, such as those monovalent hydrocarbon groups delineated above for $R^1$ and $R^2$.

In the above formula for Q, $R^4$ denotes a divalent hydrocarbon group having from 2 to 10 carbon atoms such as ethylene groups, propylene groups, isopropylene groups and butylene groups. Preferably, $R^4$ is a propylene group.

A highly preferred Q group, therefore, has the formula

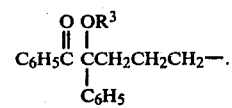

In the above siloxane unit formula, $R^5$ denotes a monovalent hydrocarbon group having from 1 to 10 carbon atoms or a halogenated monovalent hydrocarbon group. Examples of suitable monovalent hydrocarbon groups include alkyl groups such as methyl groups, ethyl groups, propyl groups and octyl groups; aryl groups such as phenyl groups, tolyl groups and xylyl groups; cycloaliphatic groups such as cyclohexyl groups; and arylalkyl groups such as benzyl groups, 2-phenylethyl groups and 2-phenylpropyl groups. Examples of suitable halogenated monovalent hydrocarbon groups include 3-chloropropyl groups, 3-chloro-2-methylpropyl groups 3,3,3-trifluoropropyl groups and chlorophenyl groups.

The organopolysiloxane sensitizers of this invention can contain, in addition to siloxane units bearing Q groups, siloxane units which are free of Q groups. These other siloxane units are not specifically restricted and can contain alkyl groups, aryl groups, cycloaliphatic groups, arylalkyl groups and halogenated groups, as delineated above for $R^5$, as well as hydrogen atoms, mercaptoalkyl groups, hydroxyalkyl groups and alkenyl groups, such as vinyl and allyl.

Examples of suitable siloxane units free of Q groups include dimethylsiloxane, methylallylsiloxane, methylvinylsiloxane, methylphenylsiloxane, diphenylsiloxane, methyloctylsiloxane, methyl(3,3,3-trifluoropropyl)-siloxane, methyl(3-chloropropyl)siloxane, methyl (2-methyl-3-chloropropyl)siloxane, methyl (3-mercaptopropyl) siloxane, methyl (2-methyl-3-mercaptopropyl)-siloxane and other diorganosiloxanes; trimethylsiloxane, dimethylvinylsiloxane, dimethylallylsiloxane, dimethylphenylsiloxane, methylphenylvinylsiloxane, dimethyl(3,3,3-trifluoropropyl) siloxane, and other triorganosiloxanes; methylsiloxane, propylsiloxane, vinylsiloxane, phenylsiloxane, (3-chloropropyl)siloxane, (2-methyl-3-chloropropyl)siloxane, (3-mercaptopropyl)-siloxane, allylsiloxane, (2-methyl-3-mercaptopropyl)-siloxane, (3,3,3-trifluoropropyl)siloxane, and other monoorganosiloxanes; methylhydrogensiloxane, dimethylhydrogensiloxane, hydrogensiloxane, and other siloxanes containing hydrogen atoms directly bonded to silicon atoms.

Said siloxane units free of Q groups preferably have the formula $R_c^5H_dSiO_{(4-c-d)/2}$ wherein $R^5$ denotes those groups $R^5$ delineated above. The values of c, d and c+d can be, independently, 0, 1, 2 or 3. Preferably, c has a value of 1, 2 or 3 and d has a value of 0 or 1 thereby providing siloxane units having the formulae $R^5SiO_{3/2}$, $R_2^5SiO_{2/2}$, $R_3^5SiO_{1/2}$, $R^5HSiO_{2/2}$ and $R_2^5HSiO_{1/2}$.

The structure of the organopolysiloxane photosensitizer can be linear, branched, cyclic, or network. Its degree of polymerization, i.e. the number of siloxane units, is at least 2 with an upper limit as high as the maximum possible degree of polymerization, generally about 10,000. However, it is preferable for the degree of polymerization to be less than 1,000 from the viewpoint of the miscibility of the sensitizer. It is sufficient that each molecule have at least one group possessing the benzoin derivative structure. It is also sufficient that each molecule have at least one organosiloxane unit containing this group. At the upper limit, the organosiloxane units can all contain a group possessing the benzoin derivative structure. Nevertheless, if the number of the groups possessing the benzoin derivative structure is too low, sensitization will be insufficient. If the number is too high, the miscibility with photosensitive resins, especially with photosensitive silicone resins and photosensitive organopolysiloxanes, will decrease. Therefore, it is preferable to have this group present at 0.2% to 50% of the total number of organic groups ($R^5$+Q) in each molecule.

A preferred embodiment of the present invention is an organopolysiloxane photosensitizer wherein all $R^5$ groups are methyl groups. The resulting methyl-containing photosensitizers are particularly useful in the methyl silicone photocurable resins delineated below.

A particularly useful embodiment of the present invention is the fluid organopolysiloxane photosensitizers, illustrated by the examples disclosed below and encompassed by the general formula $R_3^5SiO(R_2^5SiO)_x(R^5HSiO)_y(R^5QSiO)_zSiR_3^5$. Herein $R^5$ and Q are as delineated above, preferably $CH_3$ and

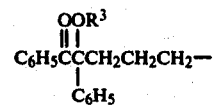

respectively, and x, y and z have average values such that their sum is less than 1000 and z is at least 1. The values of x and y can both be zero; however the value of x is typically greater than zero.

The organopolysiloxane photosensitizers of this invention can be prepared by two general methods, both comprising a hydrosilylation reaction between an alkenyl-substituted benzoin reactant and a reactant bearing at least one silicon-bonded hydrogen atom, and both general methods comprising an aspect of this invention. Other methods of preparation may also be suitable.

In these two general methods of preparation the alkenyl-substituted benzoin reactant has the formula

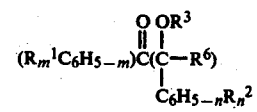

wherein $R^1$, $R^2$ and $R^3$ denote the same general and preferred groups denoted above and m and n denote the same general and preferred integers noted above. These groups and integers are carried, unchanged, in these two general methods, from the alkenyl-substituted benzoin reactant into the organopolysiloxane photosensitizer.

The $R^6$ group of the alkenyl-substituted benzoin reactant is an aliphatically unsaturated monovalent hydrocarbon group having the same number of carbon atoms, i.e. 2 to 10, as the $R^4$ group denoted above and becomes said $R^4$ group after the hydrosilylation reaction with the silicon-bonded hydrogen atom. Examples of suitable $R^6$ groups include

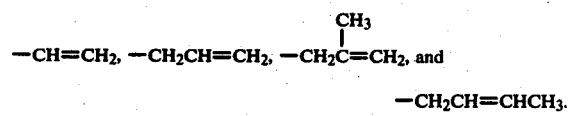

Of course, it is to be understood that whereas a given $R^6$ group provides an $R^4$ group having the same number of carbon atoms after the hydrosilylation reaction, the structure of the resulting $R^4$ group can vary. For example, an $R^6$ group having the structure $-CH_2CH=CH_2$ group can provide an $R^4$ group having the structure

depending on the mode of addition of the reacting silicon atom and the reacting hydrogen atom of the reactant bearing at least one silicon-bonded hydrogen atom.

The alkenyl-substituted benzoin derivative to be used in these syntheses can be synthesized by a one-step reaction between readily available substituted or unsubstituted benzoins, or alkyl ethers thereof and an alkenyl halide. In other words, it can be obtained by a reaction between a substituted or unsubstituted benzoin, or alkyl ether thereof, and an alkenyl halide by use of a solvent such as ether, tetrahydrofuran, acetone, dimethoxy ethane, dimethylsulfoxide, or dimethylformamide in the presence of a base such as sodium amide, potassium carbonate, triethylamine, sodium hydroxide, potassium hydroxide, barium oxide, silver oxide, or sodium hydride. If necessary, a catalyst such as an iodide, for example, potassium iodide, can be added. Examples of specific benzoin derivatives are benzoin and benzoin ethyl ether. Examples of alkenyl halides are vinyl chloride, allyl chloride, allyl bromide, methallyl chloride, and crotyl chloride.

As an example of the synthesis of an alkenyl-substituted benzoin derivative to be used in these syntheses, the allylation of benzoin with allyl chloride according to the following reaction sequence is disclosed.

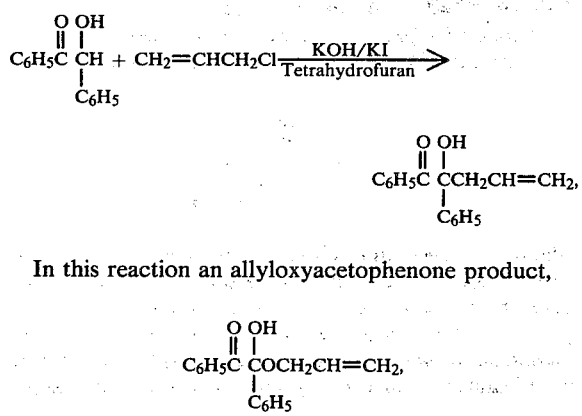

In this reaction an allyloxyacetophenone product,

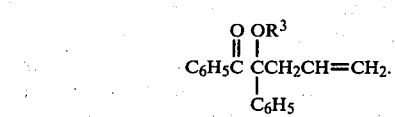

is not obtained in any detectable amounts and the indicated allyl-substituted benzoin is obtained in virtually fixed amounts. As for the mechanics of this reaction, it is not clear whether the allyl-substituted benzoin is obtained directly from the reactants or is obtained from an intermediate such as the allyloxyacetophenone. Benzoin alkyl ethers, such as benzoin ethyl ether or benzoin isopropyl ether provide allyl-substituted benzoin alkyl ethers, in like manner.

In a first of said two general methods for preparing the organopolysiloxane photosensitizers of this invention the alkenyl-substituted benzoin reactant is reacted with an organohydrogenopolysiloxane reactant bearing at least one silicon-bonded hydrogen atom to provide the organopolysiloxane photosensitizers of this invention.

The organohydrogenpolysiloxane reactant used in the hydrosilylation reaction can be straight chained, branched chained, cyclic or network. The degree of polymerization is at least 2 and can go as high as the maximum possible degree of polymerization which can take place without destroying the hydrogen-silicon bonds. For the reasons noted above for the organopolysiloxane photosensitizers of this invention, however, the degree of polymerization of the organohydrogenpolysiloxane reactant is likewise preferably less than 1000.

The siloxane units of said organohydrogenpolysiloxane can be organohydrogensiloxane units, diorganohydrogensiloxane units, hydrogensiloxane units, organodihydrogensiloxane units, diorganosiloxane units, triorganosiloxane units and organosiloxane units. Examples of the organo groups in said organohydrogenpolysiloxane and in said siloxane units include, but are not limited to, alkyl groups such as the methyl group, ethyl group, propyl, octyl group; haloalkyl groups such as the 3-chloropropyl group, 2-methyl-3-chloropropyl group, 3,3,3-trifluoropropyl group; aryl groups such as the phenyl group and tolyl group; arylalkyl groups such as the 2-phenylethyl group and 1-phenylethyl group; mercaptoalkyl groups such as the 3-mercaptopropyl group, 2-methyl-3-mercaptopropyl group; and hydroxyalkyl groups such as the hydroxypropyl group.

The organohydrogenpolysiloxane reactant is preferably composed of siloxane units having the formula $R_c^5H_dSiO_{(4-c-d)/2}$ wherein $R^5$, c, d, and c+d having the same general and preferred meanings as noted above for siloxane units which are free of Q groups with the requirement that at least one of the siloxane units bears a silicon-bonded hydrogen atom.

A preferred organohydrogenpolysiloxane to be used in this first method of photosensitizer preparation has the formula $R_3^5SiO(R_2^5SiO)_x(R^5HSiO)_wSiR_3^5$ wherein x and w denote integers whose sum has a value of less than 1000. After the hydrosilylation reaction with the alkenyl-substituted benzoin reactant, this preferred organohydrogenpolysiloxane will give rise to the preferred organopolysiloxane photosensitizer noted above and having the formula $R_3^5SiO(R_2^5SiO)_x(R^5HSiO)_y(R^5QSiO)_zSiR_3^5$ wherein the sum of y+z has a value equal to the value of w. To obtain the methyl-containing organopolysiloxane photosensitizers that are particularly useful in methyl silicone photocurable resins referred to above and delineated below, all $R^5$ groups in the organohydrogenpoly-siloxane reactant are methyl groups. Additionally, the alkenyl-substituted benzoin reactant preferably has the formula $$\underset{C_6H_5}{\overset{O}{\underset{\|}{C_6H_5C}}\ \overset{OR^3}{\underset{|}{CCH_2CH}}=CH_2.}$$

As noted above, x can have a value of zero; however, it is typically greater than zero in the organohydrogenpolysiloxane reactant. Also, as noted above, y can have a value of zero, a condition resulting from the reaction of all silicon-bonded hydrogen atoms with the alkenyl-substituted benzoin reactant, and the value of w then equals the value of z.

In a second of said two general methods for preparing the organopolysiloxane photosensitizers of this invention an alkenyl-substituted benzoin reactant is first reacted, by a hydrosilylation reaction, with a silane which contains at least one silicon-bonded hydrogen atom and at least one silicon-bonded hydrolyzable group or with a siloxane bearing at least two siloxane units and at least one silicon-bonded hydrogen atom. The resulting reaction product, herein designated as the adduct, is thereafter polymerized with itself or with another silane bearing at least one silicon-bonded hydrolyzable group or with another siloxane. Said another silane and said another siloxane are free of silicon-bonded benzoin-containing groups.

In this second method the alkenyl-substituted benzoin reactant has the same structure as the general and preferred structures described in the first method, above.

The silane reactant containing hydrogen atoms bonded to silicon atoms for the addition reaction with the alkenyl-substituted benzoin reactant in said second method preferably has the formula $R_e^5HSiZ_{3-e}$. The $R^5$ groups in this formula are the same as noted above. Z denotes a hydrolyzable group such as a halogen atom, preferably a chlorine atom; or an alkoxy group such as a methoxy group or an ethoxy group, or an acyloxy group such as an acetoxy group or a propionoxy group. The value of e is 0, 1 or 2, thereby providing silanes such as $HSiZ_3$ such as trichlorosilane or trimethoxysilane, $R^5HSiZ_2$ such as methyldichlorosilane, methyldiethoxysilane, methyldimethoxysilane or methyldiacetoxysilane, and $R_2^5HSiZ$ such as dimethylchlorosilane.

The adduct resulting from the hydrosilylation reaction between the alkenyl-substituted benzoin reactant and the preferred silane reactant has the formula $R_e^5Q\text{-}SiZ_{3-e}$ wherein $R^5$, Q, Z and e are as described above. Examples of suitable silane adducts include, but are not limited to, $QSiZ_3$ such as $QSiCl_3$ or $QSi(OCH_3)_3$, $(CH_3)QSiZ_2$ such as $(CH_3)QSiCl_2$ or $(CH_3)QSi(OCH_3)_2$ or

and $(CH_3)_2QSiZ$ such as $(CH_3)_2QSiCl$ wherein Q is most preferably the

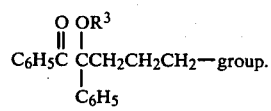

group.

The siloxane reactant containing at least two siloxane units and at least one silicon-bonded hydrogen atom for the hydrosilylation reaction with the alkenyl-substituted benzoin reactant in said second method can be the organohydrogenpolysiloxane reactant denoted above in the first method of this invention. As noted above, this preferred organohydrogenpolysiloxane can be straight chained, branched chained, cyclic or network in structure. The adduct resulting from a hydrosilylation reaction between the alkenyl-substituted benzoin reactant and this organohydrogenpolysiloxane reactant is, of course, the organopolysiloxane photosensitizer that is produced by the above-described first method of preparation; however, in this second method of preparation said adduct is further reacted by a siloxane polymerization reaction, with another silane or another siloxane, both free of silicon-bonded Q groups, to produce new organopolysiloxane photosensitizers of this invention. In this second method of preparation the organohydrogenpolysiloxane reactant is preferably cyclic in structure such as $(CH_3HSiO)_4$, i.e. tetramethyl-tetrahydrocyclotetrasiloxane, or $(CH_3HSiO)_3$, i.e. trimethyl-trihydrocyclotrisiloxane, or larger cyclics or mixtures thereof.

In this second method the siloxane reactant containing at least two siloxane units and at least one silicon-bonded hydrogen atom can also be an organohydrogenpolysiloxane further containing silicon-bonded hydroxyl groups or silicon-bonded hydrolyzable groups which are convertible to silicon-bonded hydroxyl groups. These hydrolyzable groups are the same as the Z groups denoted above.

Examples of organohydrogenpolysiloxane reactants containing hydrolyzable groups or hydroxyl groups include hydroxyl-endblocked organohydrogenpolysiloxane such as $HO\{(CH_3)_2SiO\}_x\{(CH_3)(H)SiO\}_wH$ or methoxy-endblocked organohydrogenpolysiloxanes such as $(CH_3O)_2(CH_3)SiO\text{—}\{(CH_3)_2SiO\}_x\{(CH_3)(H)SiO\}_wSi(CH_3)(OCH_3)_2$ wherein x and w are as noted above.

For hydrosilylation addition reactions in either method of this invention between alkenyl-substituted benzoin derivatives and silanes or siloxanes containing hydrogen atoms bonded directly to silicon atoms, catalysts to be used are benzoyl peroxide, di-t-butyl peroxide or other peroxides; platinum, palladium, rhodium, nickel, cobalt or other metals in powdered form or in complexes. Platinum sponge, platinum black, chloroplatinic acid, the reaction product of chloroplatinic acid and alcohol, a complex of chloroplatinic acid and vinyl siloxane and other platinum catalysts are preferably used. This addition reaction is preferably carried out so that the alkenyl-substituted benzoin derivative is reacted at a mole ratio of 1 or less with respect to the hydrogen atoms bonded to the silicon atoms. This addition reaction can be carried out in the absence or presence of a solvent. Typically, an alkenyl-substituted benzoin derivative is first heated and melted, then mixed with a silane or siloxane containing hydrogen atoms bonded to silicon atoms. While these are being vigorously mixed, a catalyst is added to promote the reaction. The addition reaction is completed to a homogeneous system. However, it is preferable to add a solvent such as benzene, toluene or xylene to give a homogeneous starting system for the reaction.

The adduct that is obtained in the first step of the second method of this invention is subsequently further reacted, in a siloxane polymerization reaction, with itself or with another silane bearing at least one silicon-bonded hydrolyzable group or with another siloxane. Said siloxane polymerization reaction can be a hydrolysis and siloxane condensation reaction and/or a siloxane equilibration reaction in the well-known manner. The hydrolysis and condensation can be carried out by conventionally known methods if hydrolyzable groups are present. If hydrolyzable groups are not present, the equilibrium polymerization can be carried out in the presence of a conventionally known basic or acidic catalyst.

Said other silanes or other siloxanes are those which do not contain groups possessing the benzoin derivative structure. Examples are organotrichlorosilane, diorganodichlorosilane, triorganochlorosilane, organotrialkoxysilane, diorganodialkoxysilane, triorganoalkoxysilane, organotriacetoxysilane, diorganodiacetoxysilane, triorganoacetoxysilane, diorgano(methyl ethyl ketoxime)silane, tetraorganodialkoxydisiloxane, pentaorganotrialkoxytrisiloxane, triorganopentalkoxytrisiloxane, α, ω-dihydroxydiorganosiloxane oligomer, octaorganocyclotetrasiloxane and hexaorganodisiloxane.

The photopolymerization sensitizers of the present invention can be applied to various photosensitive resins. However, their characteristics are best exhibited when they are applied specifically to photosensitive silicone resins and photosensitive organopolysiloxanes. In other words, the sensitizers widely used conventionally and containing benzophenone, Michler's ketone and benzoin as major ingredients have at most 2% miscibility with photosensitive silicone resins and photosensitive organopolysiloxanes. However, the sensitizers of the present invention are miscible in much larger amounts with the photosensitive silicone resins and photosensitive organopolysiloxanes. In a mixed state with photosensitive silicone resins or photosensitive organopolysiloxanes, they do not separate out or form deposits even after long-term storage. They do not have the problems of conventional sensitizers such as benzophenone and Michler's ketone, in which the sensitizers crystallize out after radiation-hardening. They can be used at high concentrations. A high sensitization effect can be expected.

The miscibilities of the photopolymerization sensitizers of the present invention will be good if the sensitizers are selected so that they have molecular structures or contain organic groups identical or similar to the molecular structures or organic groups of photosensitive silicone resins and photosensitive organopolysiloxanes.

For example, if a photosensitive organopolysiloxane has a linear structure, is liquid and contains methyl groups as the major organic groups, it is preferable to select a photopolymerization sensitizer of the present invention which also has a linear or cyclic structure, is liquid and contains methyl groups as the major organic groups, other than those groups possessing the benzoin derivative structure.

The sensitizers of the present invention can be applied to those photosensitive silicone resins and photosensitive organopolysiloxanes known to date, such as organopolysiloxanes containing acryloxy groups (Japanese Pat. Sho No. 53(1978)-2911, Japanese Pat. Sho No. 53(1978)-36515, and Japanese Pat. Sho No. 55(1980)-4770), compositions of organopolysiloxanes having SiH bonds and organopolysiloxanes containing unsaturated groups such as vinyl groups (Japanese Pat. Sho No. 52(1977)-40334), and compositions of organopolysiloxanes having mercapto groups and organopolysiloxanes containing unsaturated groups such as vinyl groups (Japanese Pat. Sho No. 54(1979)-43017). The sensitizers of the present invention are highly miscible with all of the photosensitive silicone resins and photosensitive organopolysiloxanes. They can be blended in large amounts. They show a high sensitizing action. In the present invention, the term "photosensitization" refers to sensitization by ultraviolet rays, electrons and other high-energy rays.

The following examples are disclosed to further illustrate, and to teach how to practice, the present invention. These examples shall not limit the present invention as delineated by the appended claims.

All parts and percentages refer to parts by weight and percentage by weight, unless otherwise indicated. Me denotes the methyl group. Viscosities are the values at 25° C.

EXAMPLE 1

This example illustrates an organopolysiloxane photosensitizer of this invention, its preparation by the second method of this invention and its use in a photosensitive silicone composition.

Benzoin (21.2 parts), potassium hydroxide (5.6 parts), and potassium iodide (0.83 parts) were mixed in tetrahydrofuran (THF) (50 parts). Allyl chloride (9.2 parts) was added dropwise while heating and stirring, and a reflux was continued for 5 hours. The reaction product was rinsed with water after cooling, the solvent was removed by distillation, and the residue was recrystallized from methanol to provide an allyl-substituted benzoin with a melting point of 94.5° C., namely, α-allyl-α-hydroxy-α-phenylacetophenone, (23 parts). The yield was 92%.

NMR (δ value in carbon tetrachloride): 2.45–3.10 (m, 2H), 3.95 (s, 1H), 4.60–6.00 (m, 3H), 6.70–7.80 (m, 10H). IR(cm$^{-1}$): 3460 (—OH), 1678(C=O).

α-Allyl-α-hydroxy-α-phenylacetophenone (2.5 parts) and methyldimethoxysilane (1.1 parts) were mixed and heated to 60° C., and a 1% THF solution of chloroplatinic acid (0.01 parts) was added dropwise while stirring. The temperature was gradually increased and after 1 hour at 90°–100° C. straight chain polydimethylsiloxane with hydroxyl end-groups and trimethylsilyl end-groups (Me$_3$Si content 2%) (50 parts), toluene (50 parts), and a 10% ethanol solution of KOH (0.01 parts) were added. The mixture was heated, and the alcohol and water which formed were removed. After the reaction product had been neutralized with trimethylchlorosilane and the solvent had been distilled off at reduced pressure, an organopolysiloxane photosensitizer of this invention having a viscosity of 250 cp (40 parts) was obtained.

The organopolysiloxane photosensitizer of this invention (0.5 parts) was mixed in a mixture of polysiloxane whose termini were closed by dimethylvinylsiloxane units and which contained about 90 mol% dimethylsiloxy units and 10 mol% methylvinylsiloxy units (5 parts) and a methylhydrogen polysiloxane whose termini were closed with trimethylsiloxy units (0.4 parts). It dispersed completely and uniformly. This composition was made into a membrane with a thickness of 10 μm, and irradiated with ultraviolet rays for 30 seconds from a distance of 5 cm with a high pressure mercury lamp (160 W/cm). A rubber-like cured membrane was formed, and there was no sticky sensation at all.

EXAMPLE 2

This example is a duplication of Example 1 except that the alkenyl-substituted benzoin derivative was allyl-substituted benzoin ethyl ether instead of allyl-substituted benzoin.

Benzoin ethyl ether (24 parts), potassium hydroxide (5.6 parts), and potassium iodide (0.83 parts) were mixed in THF (50 parts). Allyl chloride (9.2 parts) was added dropwise while heating and stirring, and a reflux was continued for 16 hours. The reaction mixture was washed with water after cooling, and the solvent was removed by distillation. When distillation was continued at reduced pressure, a sticky liquid (boiling point 138° C./0.8 mm Hg) (25 parts) was obtained. This was α-allyl-α-ethoxy-α-phenylacetophenone. The yield was 89%.

NMR (δ value in carbon tetrachloride): 1.08 (t, J=4 Hz, 3H), 2.50–3.30 (m, 2H), 3.30–3.95 (m, 2H), 4.60–5.90 (m, 3H), 6.70–8.00 (m, 10H).
IR (cm$^{-1}$): 1684 (C=O), 1645 (—CH—CH$_2$).

α-Allyl-α-ethoxy-α-phenylacetophenone (2.8 parts) and methyldimethoxsilane (1.1 parts) were reacted by the same method as in Example 1 with an chloroplatinic acid catalyst. Then straight chain polydimethylsiloxane with hydroxy end-groups and trimethylsilyl end-groups (Me$_3$Si content 2%) (50 parts), toluene (50 parts), and a 10% ethanol solution of KOH (0.01 parts) were added. Otherwise, this was treated in the same manner as Example 1. An organopolysiloxane photosensitizer of this invention having a viscosity of 250 cp (40 parts) was obtained.

The organopolysiloxane photosensitizer was mixed in a mixture of the polysiloxane containing vinyl groups and the polysiloxane containing hydrogen atoms bonded to silicone atoms that was used in Example 1 until it formed 10% of the mixture. It was dissolved completely. This composition was made into a membrane with a thickness of 10 μm and irradiated with ultraviolet rays from a distance of 5 cm with a high pressure mercury lamp (160 W/cm). It cured completely in 20 seconds.

EXAMPLE 3

This example illustrates on organopolysiloxane photosensitizer of this invention, its preparation by the first method of this invention and its use in a photosensitive silicone composition.

α-Allyl-α-hydroxy-α-phenylacetophenone (2.4 parts) and the siloxane expressed by average composition formula $Me_3SiO(Me_2SiO)_{130}(MeHSiO)_{10}SiMe_3$ (40 parts) were heated to 90° C. and mixed by stirring. Then a 1% THF solution of chloroplatinic acid (0.01 parts) was added dropwise. After being heated at 90°-100° C. for 30 minutes, the reaction mixture was cooled, and filtered to provide an organopolysiloxane photosensitizer of this invention having a viscosity of 310 cp (35 parts).

A portion (0.5 parts) of this photosensitizer was uniformly mixed in a mixture of polysiloxane whose termini were closed with dimethylvinylsiloxane units and which contained about 80 mol% dimethylsiloxane units and 20 mol% methylvinylsiloxane units (5 parts) and a methylhydrogenpolysiloxane whose termini were closed with trimethylsiloxy units (1 part). This composition was made into a membrane with a thickness of 100 μm, and when irradiated with ultraviolet rays from a distance of 5 cm with a high pressure mercury lamp (160 W/cm), it cured to an elastomeric state in 15 seconds.

Another portion (0.5 part) of the photosensitizer of this invention was uniformly mixed in a mixture of dimethylsiloxane whose termini were closed with dimethylvinylsiloxy units and which contained 0.5% vinyl units (3 parts) and a polysiloxane whose termini were closed with trimethylsiloxane units and which contianed 3 mol% mercaptopropylmethylsiloxy units and 97 mol% dimethylsiloxy units (2 parts). This composition was made into a membrane with a thickness of 10 μm, and when irradiated with ultraviolet rays from a distance of 5 cm with a high pressure mercury lamp (160 W/cm), it cured in less than 1 second.

EXAMPLE 4

This example is a duplicate of Example 3 except that the alkenyl-substituted benzoin derivative was allyl-substituted benzoin ethyl ether instead of allyl-substituted benzoin.

α-Allyl-α-ethoxy-α-phenylacetophenone (2.4 parts) and the siloxane expressed by the average composition formula $Me_3SiO(Me_2SiO)_{130}(MeHSiO)_{10}SiMe_3$ (40 parts) were heated to 90° C. and mixed by stirring. Then a 1% THF solution of chloroplatinic acid (0.01 parts) was added dropwise. After the temperature was maintained at 90°-100° C. for 30 minutes, the reaction mixture was cooled and filtered to provide a organopolysiloxane photosensitizer of this invention having a viscosity of 310 cp (35 parts).

A portion (0.5 parts) of this photosensitizer was uniformly mixed in a mixture of polysiloxane in which the termini were closed with dimethylvinylsiloxy units and which contained 85 mol% dimethylsiloxy units and 15 mol% methylvinylsiloxy units (5 parts) and methylhydrogen-polysiloxane whose termini were closed with trimethylsiloxy units. This composition was made into a membrane with a thickness of 200 μm, and when irradiated with ultraviolet rays from a distance of 5 cm with a high pressure mercury lamp (160 W/cm), it cured to the elastomeric state in 20 seconds.

Also, when this sensitizer (0.5 part) was mixed in a mixture of dimethylsiloxane whose termini were closed with dimethylvinylsiloxy units and which contained 0.5% vinyl units (3 parts) and a polysiloxane whose termini were closed with trimethylsiloxy units and which contained 3 mol% mercaptopopylmethylsiloxy units and 97 mol% dimethylsiloxy units (2 parts), it became completely uniform. This composition was made into a membrane with a thickness of 10 μm, and when irradiated with ultraviolet rays from a distance of 5 cm with a high pressure mercury lamp (160 W/cm), it cured in less than 1 second.

That which is claimed:

1. An organopolysiloxane photosensitizer comprising an average of at least two siloxane units, of which at least an average of one siloxane unit per organopolysiloxane molecule has the formula $Q_aR_b^5SiO_{(4-a-b)/2}$, wherein Q denotes a benzoin-containing group having the formula

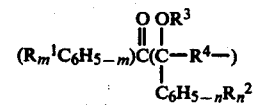

$R^1$ and $R^2$ each denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon atoms or a halogenated monovalent hydrocarbon group; m is an integer of from 1 to 5, n is an integer of from 1 to 5, a is an integer of from 1 to 3, b is an integer of from 0 to 2 and a+b is an integer of from 1 to 3.

2. A composition according to claim 1 wherein any siloxane unit in the organopolysiloxane photosensitizer molecules not bearing a Q group has the formula $R_c^5H_dSiO_{(4-c-d)/2}$ wherein c, d and c+d are integers of from 0 to 3.

3. A composition according to claim 2 wherein the average number of Q groups in the organopolysiloxane molecule is equal to from 0.2% to 50% of the total number of Q groups plus $R^5$ groups in the organopolysiloxane molecule.

4. A composition according to claim 1, 2 or 3 wherein each $R^5$ denotes a methyl group and a has a value of 1.

5. A composition according to claim 4 wherein the organopolysiloxane photosensitizer has the formula

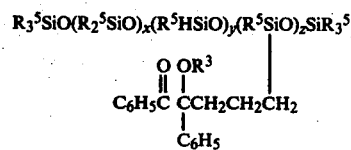

wherein x, y and z denote integers whose sum has a value of less than 1000.

6. A method for preparing an organopolysiloxane photosensitizer comprising an average of at least two siloxane units, of which at least an average of one siloxane unit per organopolysiloxane molecule has the formula $Q_aR_b{}^5SiO_{(4-a-b)/2}$, said method comprising reacting, by a hydrosilylation reaction, an alkenyl-substituted benzoin reactant having the formula

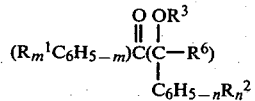

and an organohydrogenpolysiloxane reactant containing at least than two siloxane units and at least one silicon-bonded hydrogen atom per molecule, wherein Q denotes a benzoin-containing group having the formula

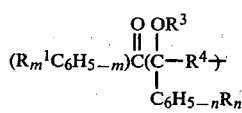

at each occurrence $R^1$ and $R^2$ denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon atoms or a halogenated monovalent hydrocarbon group; $R^6$ denotes an aliphatically unsaturated monovalent hydrocarbon group having the same number of carbon atoms as the $R^4$ group; m is an integer of from 1 to 5, n is an integer of from 1 to 5, a is an integer of from 1 to 3, b is an integer of from 0 to 2 and a+b is an integer of from 1 to 3 whereby the $R^6$ group becomes the $R^4$ group during said reaction.

7. A method according to claim 6 wherein the organohydrogenpolysiloxane consists of siloxane units having the formula $R_c{}^5H_dSiO_{(4-c-d)/2}$ wherein c, d and c+d are integers of from 0 to 3.

8. A method according to claim 7 wherein each $R^5$ denotes a methyl group.

9. A method according to claim 6, 7 or 8 wherein the organohydrogenpolysiloxane has the formula $R_3{}^5SiO(R_2{}^5SiO)_x(R^5HSiO)_wSiR_3{}^5$ wherein x and w denote integers whose sum has a value of less than 1000.

10. A method according to claim 9 wherein the alkenyl-substituted benzoin reactant has the formula

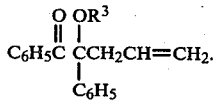

11. A method for preparing an organopolysiloxane photosensitizer comprising an average of at least two siloxane units, of which an average of at least one siloxane unit per organopolysiloxane molecule has the formula $Q_aR_b{}^5SiO_{(4-a-b)/2}$, said method comprising (A) reacting, by a hydrosilylation reaction to form an adduct, an alkenyl-substituted benzoin reactant having the formula

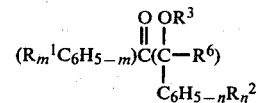

and a silane bearing at least one silicon-bonded hydrogen atom and at least one silicon-bonded hydrolyzable group or a siloxane bearing at least two siloxane units and at least one silicon-bonded hydrogen atom; and (B) polymerizing the adduct or copolymerizing the adduct with another silane bearing at least one silicon-bonded hydrolyzable radical or with a siloxane, both being free of Q groups, to provide the organopolysiloxane photosensitizer, wherein Q denotes a benzoin-containing group having the formula

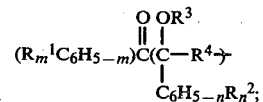

at each occurrence $R^1$ and $R^2$ denote, independently, a hydrogen atom, a halogen atom, a monovalent hydrocarbon group having from 1 to 10 carbon atoms, an alkoxy group, a thioalkoxy group, an amino group or a dialkylamino group; $R^3$ denotes a hydrogen atom or a monovalent hydrocarbon group having from 1 to 10 carbon atoms; $R^4$ denotes a divalent hydrocarbon group having from 2 to 10 carbon atoms; $R^5$ denotes a monovalent hydrocarbon group having from 1 to 10 carbon atoms or a halogenated monovalent hydrocarbon group; $R^6$ denotes an aliphatically unsaturated monovalent hydrocarbon group having the same number of carbon atoms as the $R^4$ group; m is an integer of from 1 to 5, n is an integer of from 1 to 5, a is an integer of from 1 to 3, b is an integer of from 0 to 2 and a+b is an integer of from 1 to 3; the $R^6$ group becoming the $R^4$ group during said hydrosilylation reaction.

12. A method according to claim 11 wherein the siloxane bearing at least two siloxane units and at least one silicon-bonded hydrogen atom consists of siloxane units having the formula $R_c{}^5H_dSiO_{(4-c-d)/2}$ wherein c, d and c+d are integers of from 0 to 3.

13. A method according to claim 12 wherein the siloxane bearing at least two siloxane units and at least one silicon-bonded hydrogen atom is tetramethyltetrahydrocyclotetrasiloxane having the formula $(CH_3HSiO)_4$.

14. A method according to claim 11 wherein the silane bearing at least one silicon-bonded hydrogen atom and at least one silicon-bonded hydrolyzable group has the formula $R_e{}^5HSiZ_{3-e}$ wherein e is an integer of from 0 to 2 and Z denotes a chlorine atom, an alkoxy group or an acyloxy group.

15. A method according to claim 14 wherein $R^5$ denotes a methyl radical and e has a value of 1.

16. A method according to claim 11, 12, 13, 14 or 15 wherein the alkenyl-substituted benzoin reactant has the formula

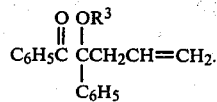

* * * * *